United States Patent
Yu et al.

(10) Patent No.: US 11,206,037 B1
(45) Date of Patent: Dec. 21, 2021

(54) ANALOGUE-TO-DIGITAL CONVERSION METHOD OF PIPELINED ANALOGUE-TO-DIGITAL CONVERTER AND PIPELINED ANALOGUE-TO-DIGITAL CONVERTER

(71) Applicant: CHENGDU HUAWEI ELECTRONIC TECHNOLOGY CO., LTD., Chengdu (CN)

(72) Inventors: Qiang Yu, Chengdu (CN); Yuanjun Cen, Chengdu (CN); Jinda Yang, Chengdu (CN)

(73) Assignee: CHENGDU HUAWEI ELECTRONIC TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 17/037,881

(22) Filed: Sep. 30, 2020

(51) Int. Cl.
| | |
|---|---|
| *H03M 1/38* | (2006.01) |
| *H03M 1/14* | (2006.01) |
| *H03M 1/12* | (2006.01) |
| *H03M 1/00* | (2006.01) |
| *H03M 1/72* | (2006.01) |
| *H02M 1/00* | (2006.01) |
| *H03M 1/66* | (2006.01) |

(52) U.S. Cl.
CPC ............ *H03M 1/145* (2013.01); *H02M 1/00* (2013.01); *H03M 1/001* (2013.01); *H03M 1/1205* (2013.01); *H03M 1/662* (2013.01); *H03M 1/72* (2013.01); *H02M 1/0093* (2021.05)

(58) Field of Classification Search
CPC ...... H03M 1/12; H03M 1/002; H03M 1/0695; H03M 1/162; H03M 1/164; H03M 1/66; H03M 1/1215; H03M 1/167; H03M 1/468; H03M 1/74; H03M 1/145; H03M 1/168; H03M 1/188; H03M 1/36; H03M 1/1225; H03M 1/005; H03M 1/1009; H03M 1/00; H03M 1/1245; H03M 1/14; H03M 1/144
USPC .................................................. 341/155, 161
See application file for complete search history.

(56) References Cited

U.S. PATENT DOCUMENTS

| | | | | |
|---|---|---|---|---|
| 6,127,958 | A * | 10/2000 | Chang ................... | H03M 1/162 341/155 |
| 6,486,820 | B1 * | 11/2002 | Allworth ............... | H03F 1/0277 341/155 |
| 6,741,194 | B1 * | 5/2004 | Cassagnes ............ | H03M 1/129 341/118 |
| 7,221,299 | B2 * | 5/2007 | Bjornsen ............. | H03M 1/0641 341/131 |

(Continued)

FOREIGN PATENT DOCUMENTS

| | | |
|---|---|---|
| CN | 104270151 A | 1/2015 |
| CN | 104363020 A | 2/2015 |

*Primary Examiner* — Linh V Nguyen

(57) ABSTRACT

The disclosure belongs to the field of integrated circuits, and is used for reducing an area overhead and a power consumption of a pipelined analog-to-digital converter. Each stage of the pipelined analog-to-digital converter according to the disclosure comprises an analogue-to-digital converter, a digital-to-analog converter, a subtractor and an amplifier. According to the disclosure, an amplification time of the pipelined ADC is used for extra quantization, and a number of bits of each ADC is reduced on the premise of not increasing a number of stages of the pipelined ADC, so that a scale of each circuit is greatly reduced, and the power consumption and the area overhead are reduced.

1 Claim, 4 Drawing Sheets

(56) References Cited

U.S. PATENT DOCUMENTS

| | | | |
|---|---|---|---|
| 9,906,233 B2 | 2/2018 | Danson et al. | |
| 2005/0168369 A1* | 8/2005 | Kobayashi | H03M 1/167 |
| | | | 341/156 |
| 2005/0200511 A1* | 9/2005 | Wada | H03M 1/164 |
| | | | 341/155 |
| 2005/0219109 A1* | 10/2005 | Kobayashi | H03M 1/186 |
| | | | 341/165 |
| 2006/0125676 A1* | 6/2006 | Kobayashi | H03M 1/162 |
| | | | 341/155 |
| 2008/0055130 A1 | 3/2008 | Sayers | |
| 2009/0102688 A1* | 4/2009 | Cesura | H03M 1/1061 |
| | | | 341/110 |
| 2013/0027231 A1* | 1/2013 | Meacham | H03M 1/0673 |
| | | | 341/110 |
| 2015/0194975 A1 | 7/2015 | Miaille et al. | |
| 2020/0321973 A1* | 10/2020 | Mugikura | H03M 1/40 |

* cited by examiner

| | | | | | |
|---|---|---|---|---|---|
| (i-1)$^{th}$ pipeline stage | Amplification | Sampling | Quantization | Amplification | Sampling | Quantization |
| i$^{th}$ pipeline stage | Sampling | Quantization | Amplification | Sampling | Quantization | Amplification |
| (i+1)$^{th}$ pipeline stage | Quantization | Amplification | Sampling | Quantization | Amplification | Sampling |

FIG. 1

| | | | | | |
|---|---|---|---|---|---|
| (i-1)$^{th}$ pipeline stage | Amplification/Quantization | Sampling | Quantization | Amplification/Quantization | Sampling | Quantization |
| i$^{th}$ pipeline stage | Sampling | Quantization | Amplification/Quantization | Sampling | Quantization | Amplification/Quantization |
| (i+1)$^{th}$ pipeline stage | Quantization | Amplification/Quantization | Sampling | Quantization | Amplification/Quantization | Sampling |

FIG. 2

ANALOGUE-TO-DIGITAL CONVERSION METHOD OF PIPELINED ANALOGUE-TO-DIGITAL CONVERTER AND PIPELINED ANALOGUE-TO-DIGITAL CONVERTER

CROSS-REFERENCE TO RELATED APPLICATIONS

This application claims priority to Chinese Patent Application No. 202010472091.4 with a filing date of May 29, 2020. The content of the aforementioned applications, including any intervening amendments thereto, are incorporated herein by reference.

TECHNICAL FIELD

The disclosure belongs to the field of integrated circuits, and particularly relates to an analog-to-digital conversion method of a pipelined analog-to-digital converter for reducing area overhead and power consumption, and the pipelined analog-to-digital converter using the method, which is mainly applied to the design of pipelined analog-to-digital converter (pipelined ADC), comprising traditional pipelined analog-to-digital converter (pipelined ADC) and pipe-successive approximation analog analog-to-digital converter (pipe-SAR ADC, wherein SAR is the abbreviation of successive approximation analog).

BACKGROUND

High-speed ADCs mainly comprise a flash ADC and a pipelined ADC. An N-bit flash ADC only needs one comparison to produce results, so it is extremely fast, but a circuit overhead thereof is proportional to 2N, so this ADC generally has low accuracy. The Pipelined ADC operates in a pipelined manner, consisting of multiple stages, wherein each stage is quantized by the flash ADC, and then remaining signals are amplified and transmitted to next stage for subsequent quantization. The Pipelined ADC can achieve higher speed and higher accuracy.

However, the overhead of the Pipelined ADC is large. If a structure of single-stage quantization with more bits and fewer stages is employed, the bits of each stage flash ADC are higher, and the corresponding power consumption and area overhead are larger. If a structure of single-stage quantization with fewer bits and more stages is employed, a time delay from signal sampling to final quantization is relatively long. After the number of stages increases, the area and power consumption will also increase.

SUMMARY

In light of this, an objective of the disclosure is to reduce an area overhead and a power consumption of a pipelined analog-to-digital converter.

In order to solve the foregoing technical problems, the disclosure provides a pipelined analog-to-digital conversion method employing T pipeline stages for analog-to-digital conversion, wherein T≥2, and performing the analog-to-digital conversion in an $i^{th}$ pipeline stage comprises three steps, wherein 1≤i≤T, step 1. sampling period of the pipeline stages: sampling the pipeline stages, wherein if i=1, the pipeline stage is a first pipeline stage and is executed according to step 1.1; and if 1<i≤T, the pipeline stage is executed according to step 1.2;

step 1.1. inputting an analog signal to be converted into the first pipeline stage, wherein an input signal of a digital-to-analog converter of the first pipeline stage is zero and an output signal of the digital-to-analog converter of the first pipeline stage is also zero, a difference between the analog signal to be converted and the output signal of the digital-to-analog converter of the first pipeline stage which is namely the analog signal to be converted, is sent into an analogue-to-digital converter of the first pipeline stage for sampling, and step 2 is executed after the sampling is completed; and step 1.2: when step 1 is executed in the $i^{th}$ pipeline stage, executing step 3 in an $(i-1)^{th}$ pipeline stage, inputting an analog signal obtained by amplifying a quantization residual of the $(i-1)^{th}$ pipeline stage by an amplifier of the $(i-1)^{th}$ pipeline stage into the in pipeline stage, and meanwhile, performing one more quantization on the quantization residual of the $(i-1)^{th}$ pipeline stage by an analogue-to-digital converter of the $(i-1)^{th}$ pipeline stage, sending an M-bit quantization result obtained by the one more quantization into a digital-to-analog converter of the $i^{th}$ pipeline stage to generate an analog output signal when the M-bit quantization result is inputted and record the analog output signal as a first analog output signal of an analogue-to-digital converter of the $i^{th}$ pipeline stage, and executing step 2 after the sampling is completed;

step 2. quantization period of the pipeline stages: quantizing the pipeline stages, wherein if i=1, the pipeline stage is the first pipeline stage and is executed according to step 2.1; and if 1<i≤T, the pipeline stage is executed according to step 2.2;

step 2.1. quantizing the analog signal to be converted by the analogue-to-digital converter of the first pipeline stage to obtain an N-bit quantization result and send the N-bit quantization result into the digital-to-analog converter of the first pipeline stage, performing, by the digital-to-analog converter of the first pipeline stage, digital-to-analogue conversion on the N-bit quantization result inputted by the analogue-to-digital converter of the first pipeline stage, outputting an analog output signal during N-bit inputting, and executing step 3 after the quantizing is completed; and step 2.2. when step 2 is executed in the $i^{th}$ pipeline stage, executing step 1 in the $(i-1)^{th}$ pipeline stage, quantizing the inputted analog signal by the amplifying analogue-to-digital converter of the $i^{th}$ pipeline stage to obtain an N-bit quantization result and send the N-bit quantization result into the digital-to-analog converter of the $i^{th}$ pipeline stage, performing, by the digital-to-analog converter of the $i^{th}$ pipeline stage, digital-to-analogue conversion together on the N-bit quantization result inputted by the analogue-to-digital converter of the $i^{th}$ pipeline stage and the M-bit quantization result inputted by the $(i-1)^{th}$ pipeline stage, outputting an analog output signal during (N+M)-bit inputting and record the analog output signal as a second analog output signal of the digital-to-analog converter of the $i^{th}$ pipeline stage, and executing step 3 after the sampling is completed; and step 3. amplification and extra quantization period of the pipeline stages: amplifying and extra quantizing the pipeline stages, wherein if i=1, the pipeline stage is the first pipeline stage and is executed according to step 3.1, if 2<i<T, the pipeline stage is executed according to step 3.2, and if i=T, the pipeline stage is a last pipeline stage and is executed according to step 3.3;

step 3.1. a difference between the analog signal to be converted and the analog output signal outputted by the digital-to-analog converter of the first pipeline stage during N-bit inputting being a quantization residual of the first pipeline stage, amplifying the quantization residual of the first pipeline stage by an amplifier of the first pipeline stage and then inputting the quantization residual of the first pipeline stage to a second pipeline stage, and meanwhile, performing one more quantization on the quantization residual of the first pipeline stage by the analogue-to-digital converter of the first pipeline stage, and sending an obtained M-bit quantization result into a digital-to-analog converter of the second pipeline stage, wherein an (N+M)-bit quantization result of the first pipeline stage is obtained by the two quantizations in step 2.1 and step 3.1;

step 3.2. a difference between the quantization residual of the (i−1) pipeline stage and the second analog output signal outputted by the digital-to-analog converter of the $i^{th}$ pipeline stage being a quantization residual of the it pipeline stage, amplifying the quantization residual of the $i^{th}$ pipeline stage by an amplifier of the $i^{th}$ pipeline stage and then inputting the quantization residual of the it pipeline stage into an $(i+1)^{th}$ pipeline stage, and meanwhile, performing one more quantization on the quantization residual of the $i^{th}$ pipeline stage by the analogue-to-digital converter of the $i^{th}$ pipeline stage, and sending an obtained M-bit quantization result into a digital-to-analog converter of the $(i+1)^{th}$ pipeline stage, wherein an (N+M)-bit quantization result of the it pipeline stage is obtained by the two quantization in step 2.2 and step 3.2; and step 3.3. a difference between a quantization residual of the $(T-1)^{th}$ pipeline stage and a second analog output signal outputted by a digital-to-analog converter of a T pipeline stage being a quantization residual of the $T^{th}$ pipeline stage, performing one more quantization on the quantization residual of the $T^{th}$ pipeline stage by an analogue-to-digital converter of the $T^{th}$ pipeline stage to obtain an M-bit quantization result, wherein an (N+M)-bit quantization result of the $T^{th}$ pipeline stage is obtained by the two quantization in step 2.2 and step 3.3; wherein 1≤N, 1≤M, and M≤N.

The disclosure further provides a pipelined analog-to-digital converter implementing the method mentioned above, comprising T pipeline stages, wherein T≥2, the T pipeline stages are coupled in a cascade manner, an $i^{th}$ pipeline stage comprises an analogue-to-digital converter, a digital-to-analog converter and a subtractor, and 1≤i≤T, wherein:

when i=1, namely in a first pipeline stage, an analog signal to be converted is inputted from an input terminal of the first pipeline stage, the input terminal of the first pipeline stage is connected with a positive input terminal of a subtractor of the first pipeline stage, an output terminal of the subtractor of the first pipeline stage is respectively connected with an input terminal of an amplifier of the first pipeline stage and an input terminal of an analogue-to-digital converter of the first pipeline stage, a first output terminal of the analogue-to-digital converter of the first pipeline stage is connected with a first input terminal of a digital-to-analog converter of the first pipeline stage, a second output terminal of the analogue-to-digital converter of the first pipeline stage is connected with a second input terminal of a digital-to-analog converter of a second pipeline stage, and an output terminal of the digital-to-analog converter of the first pipeline stage is connected with a negative input terminal of the subtractor of the first pipeline stage; an output terminal of an amplifier of the first pipeline stage is connected with an input terminal of the second pipeline stage; and the first output terminal of the analogue-to-digital converter of the first pipeline stage outputs an N-bit quantization result of a quantization period, the second output terminal of the analogue-to-digital converter of the first pipeline stage outputs an M-bit quantization result of an amplification and extra quantization period, and an (N+M)-bit quantization result of the first pipeline stage is obtained by two quantization;

when 1<i<T, in the $i^{th}$ pipeline stage, an output terminal of an amplifier of an $(i-1)^{th}$ pipeline stage is connected with an input terminal of the $i^{th}$ pipeline stage, the input terminal of the $i^{th}$ pipeline stage is connected with a positive input terminal of the subtractor of the $i^{th}$ pipeline stage, an output terminal of the subtractor of the $i^{th}$ pipeline stage is respectively connected with an input terminal of the amplifier of the $i^{th}$ pipeline stage and an input terminal of the analogue-to-digital converter of the $i^{th}$ pipeline stage, a first output terminal of the analogue-to-digital converter of the $i^{th}$ pipeline stage is connected with a first input terminal of the digital-to-analog converter of the $i^{th}$ pipeline stage, a second output terminal of the analogue-to-digital converter of the $i^{th}$ pipeline stage is connected with a second input terminal of a digital-to-analog converter of an (i+1) pipeline stage, and an output terminal of the digital-to-analog converter of the $i^{th}$ pipeline stage is connected with a negative input terminal of the subtractor of the $i^{th}$ pipeline stage; an output terminal of the amplifier of the $i^{th}$ pipeline stage is connected with an input terminal of the $(i+1)^{th}$ pipeline stage; and the first output terminal of the analogue-to-digital converter of the $i^{th}$ pipeline stage outputs the N-bit quantization result of the quantization period, the second output terminal of the analogue-to-digital converter of the $i^{th}$ pipeline stage the M-bit quantization result of the amplification and extra quantization period, and an (N+M)-bit quantization result of the $i^{th}$ pipeline stage is obtained by two quantization; and when i=T, in a $T^{th}$ pipeline stage, an output terminal of an amplifier of a $(T-1)^{th}$ pipeline stage is connected with an input terminal of the $T^{th}$ pipeline stage, the input terminal of the $T^{th}$ pipeline stage is connected with a positive input terminal of a subtractor of the $T^{th}$ pipeline stage, an output terminal of the subtractor of the $T^{th}$ pipeline stage is connected with an input terminal of an analogue-to-digital converter of the $T^{th}$ pipeline stage, a first output terminal of the analogue-to-digital converter of the $T^{th}$ pipeline stage is connected with a first input terminal of a digital-to-analog converter of the $T^{th}$ pipeline stage, the analogue-to-digital converter of the $T^{th}$ pipeline stage further comprises a second output terminal, and an output terminal of the digital-to-analog converter of the $T^{th}$ pipeline stage is connected with a negative input terminal of the subtractor of the $T^{th}$ pipeline stage; and the first output terminal of the analogue-to-digital converter of the $T^{th}$ pipeline stage outputs the N-bit quantization result of the quantization period, the second output terminal of the analogue-to-digital converter of the $T^{th}$ pipeline stage outputs the M-bit quantization result of the amplification and extra quantization period, and an (N+M)-bit quantization result of the $T^{th}$ pipeline stage is obtained by two quantization; wherein 1≤N, 1≤M, and M≤N.

BENEFICIAL EFFECTS

According to the disclosure, an amplification time of the pipelined analog-to-digital converter (pipelined ADC) is used for extra quantization, and a number of bits of each ADC is reduced on the premise of not increasing a number of stages of the pipelined analog-to-digital converter (pipelined ADC), so that a scale of each circuit is greatly reduced, and the power consumption and the area overhead are reduced.

BRIEF DESCRIPTION OF THE DRAWINGS

FIG. 1 is an operation sequence chart diagram of a traditional pipelined analog-to-digital converter;

FIG. 2 is an operation sequence chart diagram of a pipelined analog-to-digital converter according to the disclosure;

DETAILED DESCRIPTION

The embodiments of the disclosure will be further described hereinafter in detail with reference to the drawings.

An operation sequence chart diagram of a traditional pipelined analog-to-digital converter (pipelined ADC) is shown in FIG. 1, which mainly comprises a sampling period, a quantization period and an amplification period. In the amplification period, an analogue-to-digital converter (ADC) of each pipeline stage amplifies a quantization residual only.

In order to achieve the objective of the disclosure, i.e., to reduce an area overhead of the pipelined analog-to-digital converter (pipelined ADC) and reduce a power consumption of the pipelined analog-to-digital converter (pipelined ADC), a major spirit of the disclosure is to improve an operation mode of the pipelined ADC and use an amplification time to perform extra quantization. FIG. 2 shows an operation sequence chart of a pipelined analog-to-digital converter (pipelined ADC) provided by the disclosure, which mainly comprises a sampling period, a quantization period and an amplification period.

Figure 3:
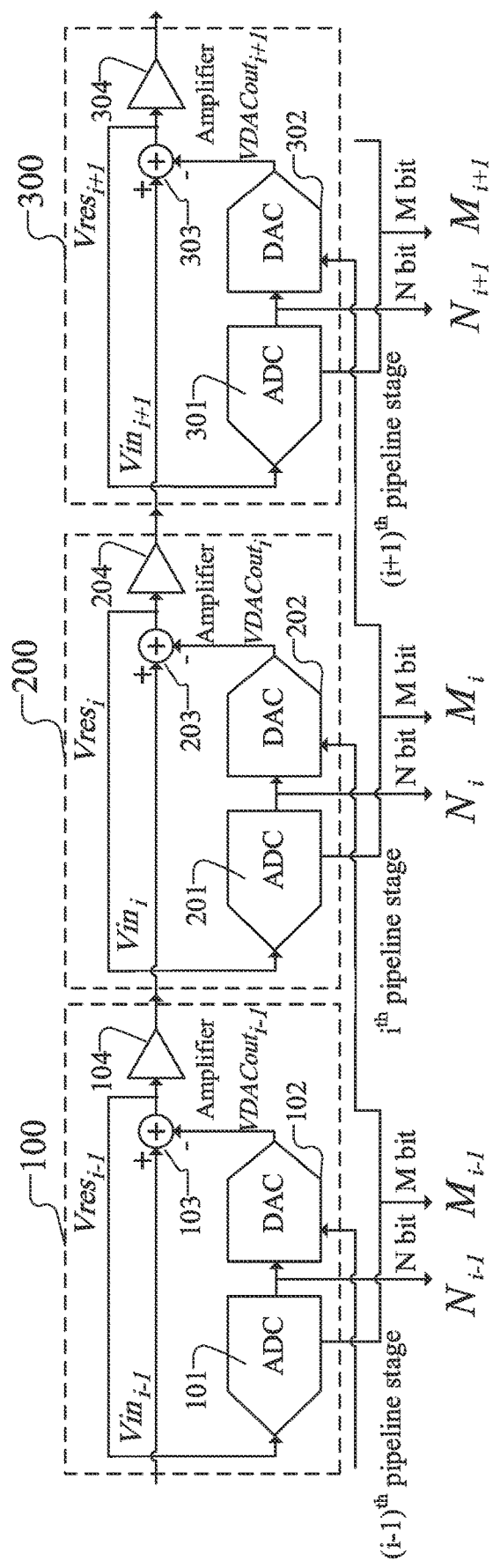
FIG. 3 is a composition block diagram of the pipelined analog-to-digital converter according to the disclosure.

FIG. 2 and FIG. 3 illustrate the pipelined analog-to-digital converter and an analog-to-digital conversion method according to the disclosure, wherein each pipeline stage comprises an analogue-to-digital converter, a digital-to-analog converter and a subtractor. As shown in the figures, a pipeline stage 200 is an $i^{th}$ pipeline stage, an $(i-1)^{th}$ pipeline stage 100 and an $(i+1)^{th}$ pipeline stage 300 are previous and next stages of the pipeline stage 200, $1 \leq i \leq T$, $T \geq 2$, and T is a number of pipeline stages. 101, 201 and 301 in the figures are analogue-to-digital converters, 102, 202 and 203 in the figures are digital-to-analog converters, 103, 203 and 303 in the figures are subtractors, while 104, 204 and 304 in the figures are amplifiers. The pipelined analog-to-digital converter at least comprises two pipeline stages, wherein three pipeline stages are drawn in the figures, which are not intended to limit that the pipelined analog-to-digital converter and the analog-to-digital conversion method of the disclosure at least comprise three pipeline stages, but are intended to illustrate an operation process of the pipeline stages. When T=2, only a first stage and a last stage are provided.

Performing the analogue-to-digital conversion in the pipeline stages of the disclosure comprise three steps, wherein step 1 is the sampling period of the pipeline stages, step 2 is the quantization period of the pipeline stages, while step 3 is the amplification and quantization period of the pipeline stages. The $i^{th}$ pipeline stage 200 is described in details hereinafter.

Step 1 is the sampling period of the $i^{th}$ pipeline stage. At this moment, an $(i-1)^{th}$ pipeline stage is in the amplification and extra quantization period, an amplifier 104 of the $(i-1)^{th}$ pipeline stage amplifies a quantization residual $Vres_{i-1}^2$ (superscript 2 represents that an output of a subtractor is an output of the quantization period) as an input signal $Vin_i$ of the $i^{th}$ pipeline stage, and the signal $Vin_i$ is sent to a minuend terminal of a subtractor 203 of the $i^{th}$ pipeline stage; when the amplifier 104 of the $(i-1)^{th}$ pipeline stage is amplifying, an analogue-to-digital converter 101 of the $(i-1)^{th}$ pipeline stage will perform one more quantization on the quantization residual $Vres_{i-1}^2$ to obtain an M-bit quantization result and send the M-bit quantization result to a digital-to-analog converter 202 of the $i^{th}$ pipeline stage to generate an output signal $VDACout_i(M_{i-1})$ only during M-bit inputting and send the output signal into a subtrahend terminal of a subtractor 103 of the $i^{th}$ pipeline stage. At this moment, an analog input signal of an analogue-to-digital converter 201 of the $i^{th}$ pipeline stage is $Vres_i^1 = Vin_i - VDACout_i(M_{i-1})$ (superscript 1 represents that an output of the subtractor is an output of the sampling period).

Step 2 is the quantization period of the it pipeline stage. The $(i-1)^{th}$ pipeline stage is in the sampling period. The analogue-to-digital converter 201 of the $i^{th}$ pipeline stage quantizes the analog input signal $Vres_i^1 = Vin_i - VDACout_i(M_{i-1})$ to obtain an N-bit quantization result N. and send the N-bit quantization result into the digital-to-analog converter 202 of the in pipeline stage and an M-bit input $M_{i-1}$ of the $(i-1)^{th}$ pipeline stage is added. At this moment, the digital-to-analog converter 202 of the $i^{th}$ pipeline stage has (N+M)-bit input, and an output $VDACout_i(N_i+M_{i-1})$ during (N+M)-bit inputting is generated. At this moment, a quantization residual $Vres_i^2 = Vin_i - VDACout_i(N_i+M_{i-1})$ of the $i^{th}$ pipeline stage is obtained.

Step 3 is the amplification and extra quantization period of the $i^{th}$ pipeline stage. An amplifier 204 of the $i^{th}$ pipeline stage will amplify the quantization residual $Vres_i^2$ at this moment to generate an input signal $Vin_{i-1}$ of the $(i+1)^{th}$ pipeline stage, and meanwhile, the analogue-to-digital converter 201 of the $i^{th}$ pipeline stage will perform one more quantization on the quantization residual $Vres_i^2$ to obtain an M-bit quantization result $M_i$ and send the M-bit quantization result to a digital-to-analog converter 302 of the $(i+1)^{th}$ pipeline stage. An (N+M)-bit quantization result of the $i^{th}$ pipeline stage is obtained through two quantization, wherein $1 \leq N$, $1 \leq M$, and $M \leq N$.

Moreover, an input signal of the first pipeline stage is an analog input signal for analogue-to-digital conversion, the digital-to-analog converter of the first pipeline stage is not provided with a second input terminal, or, the digital-to-analog converter of the first pipeline stage is provided with a second input terminal, but an input signal of the second input terminal is zero. If the pipeline stage is a last stage, the pipeline stage does not amplify the quantization residual, or, the amplified quantization residual is not outputted, and the second output terminal of the analogue-to-digital converter will not output to an analogue-to-digital converter of next pipeline stage.

Figure 4:
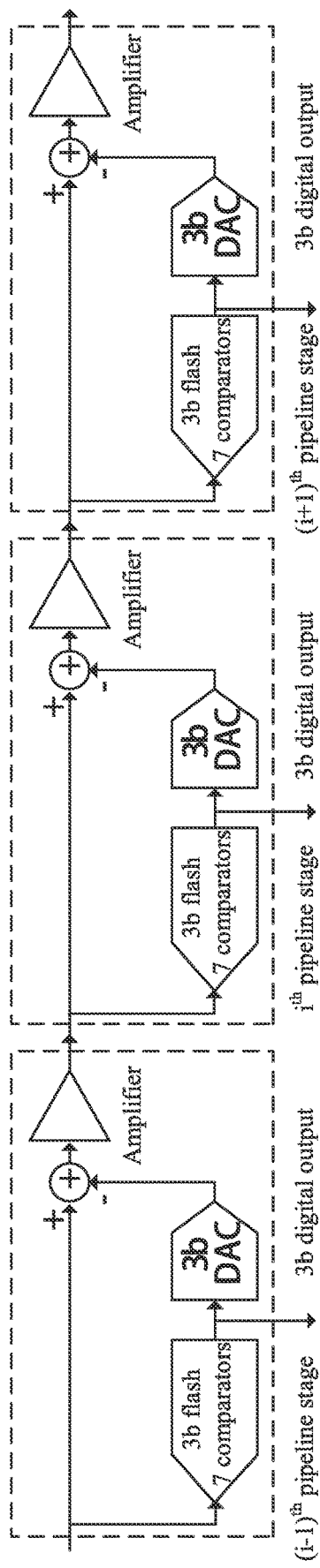
FIG. 4 is a 3-bit analog-to-digital converter employing traditional operation sequence.
Figure 5:
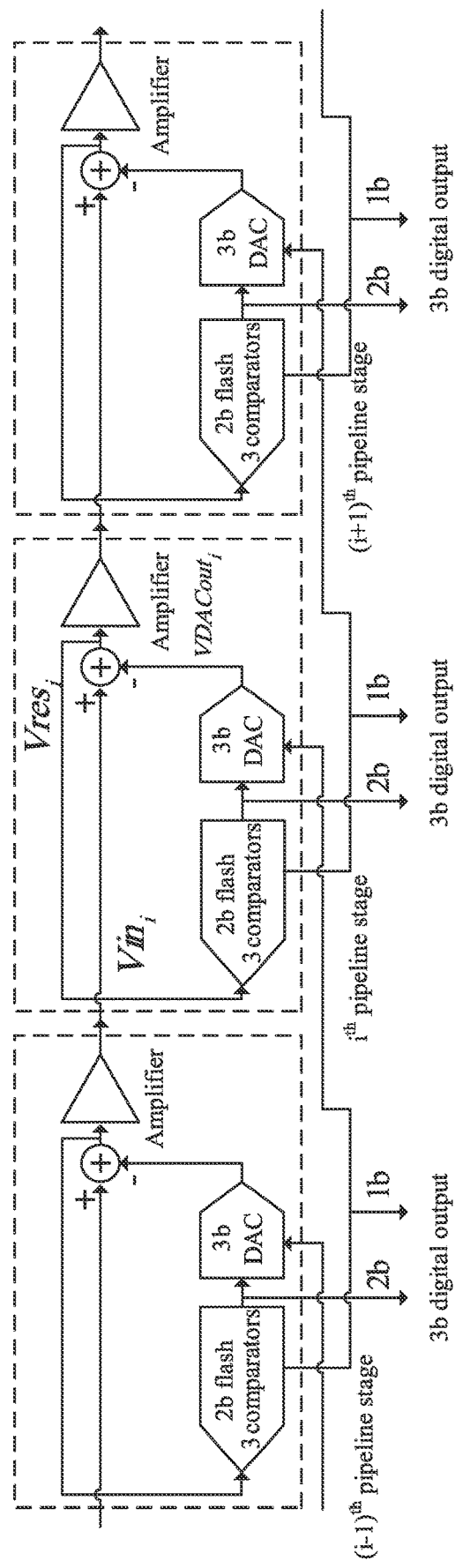
FIG. 5 is a 2-bit analogue-to-digital converter in the specific embodiments of the disclosure.

FIG. 4 is a 3-bit analog-to-digital converter employing traditional operation sequence, and FIG. 5 is a 2-bit analogue-to-digital converter in the specific embodiments of the disclosure. Referring to FIG. 3 and FIG. 4, a comparator is employed as the analogue-to-digital converter, and a 3-bit digital-to-analog converter is employed as the digital-to-analog converter. FIG. 4 represents the 3-bit structure of the traditional analogue-to-digital converter, which uses 3-bit flash to quantize once to obtain a 3-bit quantization result, wherein 7 comparators are needed. FIG. 5 represents the 3-bit structure of the analogue-to-digital converter according to the disclosure, which uses 2-bit flash to quantize twice, wherein 2 bits are quantized during the quantization period of the present pipeline stage for the first time, and 1 bit is quantized during the amplification and extra quantization period of the present pipeline stage for the second time to similarly obtain a 3-bit quantization result; however, 3 comparators are needed only.

It follows that an amplification time of the pipelined analog-to-digital converter (pipelined ADC) is used for extra quantization, and a number of bits of each ADC is reduced on the premise of not increasing a number of stages of the pipelined analog-to-digital converter (pipelined ADC), so that a scale of each circuit is greatly reduced, and the power consumption and the area overhead are reduced.

The above are only preferred embodiments of the disclosure, and are not intended to limit the disclosure. Any modification, equivalent substitution and improvement made within the ideological principle of the disclosure shall be included in the protection scope of the disclosure.

What is claimed is:

1. A pipelined analog-to-digital converter implementing a pipelined analog-to-digital conversion method employing T pipeline stages for analog-to-digital conversion, wherein T≥2, and performing the analog-to-digital conversion in an $i^{th}$ pipeline stage comprises three steps, wherein 1≤i≤T, step 1. sampling period of the pipeline stages: sampling the pipeline stages, wherein if i=1, the pipeline stage is a first pipeline stage and is executed according to step 1.1; and if 1<i≤T, the pipeline stage is executed according to step 1.2;

step 1.1. inputting an analog signal to be converted into the first pipeline stage, wherein an input signal of a digital-to-analog converter of the first pipeline stage is zero and an output signal of the digital-to-analog converter of the first pipeline stage is also zero, a difference between the analog signal to be converted and the output signal of the digital-to-analog converter of the first pipeline stage which is namely the analog signal to be converted, is sent into an analogue-to-digital converter of the first pipeline stage for sampling, and step 2 is executed after the sampling is completed; and step 1.2: when step 1 is executed in the $i^{th}$ pipeline stage, executing step 3 in an $(i-1)^{th}$ pipeline stage, inputting an analog signal obtained by amplifying a quantization residual of the $(i-1)^{th}$ pipeline stage by an amplifier of the $(i-1)^{th}$ pipeline stage into the $i^{th}$ pipeline stage, and meanwhile, performing one more quantization on the quantization residual of the $(i-1)^{th}$ pipeline stage by an analogue-to-digital converter of the $(i-1)^{th}$ pipeline stage, sending an M-bit quantization result obtained by the one more quantization into a digital-to-analog converter of the $i^{th}$ pipeline stage to generate an analog output signal when the M-bit quantization result is inputted and record the analog output signal as a first analog output signal of an analogue-to-digital converter of the $i^{th}$ pipeline stage, and executing step 2 after the sampling is completed;

step 2. quantization period of the pipeline stages: quantizing the pipeline stages, wherein if i=1, the pipeline stage is the first pipeline stage and is executed according to step 2.1; and if i<i≤T, the pipeline stage is executed according to step 2.2;

step 2.1. quantizing the analog signal to be converted by the analogue-to-digital converter of the first pipeline stage to obtain an N-bit quantization result and send the N-bit quantization result into the digital-to-analog converter of the first pipeline stage, performing, by the digital-to-analog converter of the first pipeline stage, digital-to-analogue conversion on the N-bit quantization result inputted by the analogue-to-digital converter of the first pipeline stage, outputting an analog output signal during N-bit inputting, and executing step 3 after the quantizing is completed; and step 2.2. when step 2 is executed in the $i^{th}$ pipeline stage, executing step 1 in the $(i-1)^{th}$ pipeline stage, quantizing the inputted analog signal by the amplifying analogue-to-digital converter of the $i^{th}$ pipeline stage to obtain an N-bit quantization result and send the N-bit quantization result into the digital-to-analog converter of the $i^{th}$ pipeline stage, performing, by the digital-to-analog converter of the $i^{th}$ pipeline stage, digital-to-analogue conversion together on the N-bit quantization result inputted by the analogue-to-digital converter of the $i^{th}$ pipeline stage and the M-bit quantization result inputted by the $(i-1)^{th}$ pipeline stage, outputting an analog output signal during (N+M)-bit inputting and record the analog output signal as a second analog output signal of the digital-to-analog converter of the $i^{th}$ pipeline stage, and executing step 3 after the sampling is completed; and step 3. amplification and extra quantization period of the pipeline stages: amplifying and extra quantizing the pipeline stages, wherein if i=1, the pipeline stage is the first pipeline stage and is executed according to step 3.1, if 2<i<T, the pipeline stage is executed according to step 3.2, and if i=T, the pipeline stage is a last pipeline stage and is executed according to step 3.3;

step 3.1. a difference between the analog signal to be converted and the analog output signal outputted by the digital-to-analog converter of the first pipeline stage during N-bit inputting being a quantization residual of the first pipeline stage, amplifying the quantization residual of the first pipeline stage by an amplifier of the first pipeline stage and then inputting the quantization residual of the first pipeline stage into a second pipeline stage, and meanwhile, performing one more quantization on the quantization residual of the first pipeline stage by the analogue-to-digital converter of the first pipeline stage, and sending an obtained M-bit quantization result into a digital-to-analog converter of the second pipeline stage, wherein an (N+M)-bit quantization result of the first pipeline stage is obtained by the two quantization in step 2.1 and step 3.1;

step 3.2. a difference between the quantization residual of the $(i-1)^{th}$ pipeline stage and the second analog output signal outputted by the digital-to-analog converter of the $i^{th}$ pipeline stage being a quantization residual of the $i^{th}$ pipeline stage, amplifying the quantization residual of the $i^{th}$ pipeline stage by an amplifier of the $i^{th}$ pipeline stage and then inputting the quantization residual of the $i^{th}$ pipeline stage into an $(i+1)^{th}$ pipeline stage, and meanwhile, performing one more quantization on the quantization residual of the $i^{th}$ pipeline stage by the analogue-to-digital converter of the $i^{th}$ pipeline stage, and sending an obtained M-bit quantization result into a digital-to-analog converter of the $(i+1)^{th}$ pipeline stage, wherein an (N+M)-bit quantization result of the $i^{th}$ pipeline stage is obtained by the two quantization in step 2.2 and step 3.2; and step 3.3. a difference between a quantization residual of the $(T-1)^{th}$ pipeline stage and a second analog output signal outputted by a digital-to-analog converter of a $T^{th}$ pipeline stage being a quantization residual of the $T^{th}$ pipeline stage, performing one more quantization on the quantization residual of the $T^{th}$ pipeline stage by an analogue-to-digital converter of the $T^{th}$ pipeline stage to obtain an M-bit quantization result, wherein an (N+M)-bit quantization result of the $T^{th}$ pipeline stage is obtained by the two quantization in step 2.2 and step 3.3;

wherein 1≤N, 1≤M, and M≤N;

the pipelined analog-to-digital converter comprises pipeline stages, wherein T≥2, the T pipeline stages are coupled in a cascade manner, and an $i^{th}$ pipeline stage comprises an analogue-to-digital converter, a digital-to-analog converter and a subtractor, and 1≤i≤T, wherein:

when i=1, namely in a first pipeline stage, an analog signal to be converted is inputted from an input terminal of the first pipeline stage, the input terminal of the first pipeline stage is connected with a positive input terminal of a subtractor of the first pipeline stage, an output terminal of the subtractor of the first pipeline stage is respectively connected with an input terminal of an amplifier of the first pipeline stage and an input terminal of an analogue-to-digital converter of the first pipeline stage, a first output terminal of the analogue-to-digital converter of the first pipeline stage is connected with a first input terminal of a digital-to-analog converter of the first pipeline stage, a second output terminal of the analogue-to-digital converter of the first pipeline stage is connected with a second input terminal of a digital-to-analog converter of a second pipeline stage, and an output terminal of the digital-to-analog converter of the first pipeline stage is connected with a negative input terminal of the subtractor of the first pipeline stage; an output terminal of an amplifier of the first pipeline stage is connected with an input terminal of the second pipeline stage; and the first output terminal of the analogue-to-digital converter of the first pipeline stage outputs an N-bit quantization result of a quantization period, the second output terminal of the analogue-to-digital converter of the first pipeline stage outputs an M-bit quantization result of an amplification and extra quantization period, and an (N+M)-bit quantization result of the first pipeline stage is obtained by two quantization;

when 1<i<T, in the $i^{th}$ pipeline stage, an output terminal of an amplifier of an $(i-1)^{th}$ pipeline stage is connected with an input terminal of the $i^{th}$ pipeline stage, the input terminal of the $i^{th}$ pipeline stage is connected with a positive input terminal of the subtractor of the $i^{th}$ pipeline stage, an output terminal of the subtractor of the $i^{th}$ pipeline stage is respectively connected with an input terminal of the amplifier of the $i^{th}$ pipeline stage and an input terminal of the analogue-to-digital converter of the $i^{th}$ pipeline stage, a first output terminal of the analogue-to-digital converter of the $i^{th}$ pipeline stage is connected with a first input terminal of the digital-to-analog converter of the $i^{th}$ pipeline stage, a second output terminal of the analogue-to-digital converter of the $i^{th}$ pipeline stage is connected with a second input terminal of a digital-to-analog converter of an $(i+1)^{th}$ pipeline stage, and an output terminal of the digital-to-analog converter of the $i^{th}$ pipeline stage is connected with a negative input terminal of the subtractor of the $i^{th}$ pipeline stage; an output terminal of the amplifier of the $i^{th}$ pipeline stage is connected with an input terminal of the $(i+1)^{th}$ pipeline stage; and the first output terminal of the analogue-to-digital converter of the $i^{th}$ pipeline stage outputs the N-bit quantization result of the quantization period, the second output terminal of the analogue-to-digital converter of the $i^{th}$ pipeline stage the M-bit quantization result of the amplification and extra quantization period, and an (N+M)-bit quantization result of the $i^{th}$ pipeline stage is obtained by two quantization; and when i=T, in a $T^{th}$ pipeline stage, an output terminal of an amplifier of a $(T-1)^{th}$ pipeline stage is connected with an input terminal of the $T^{th}$ pipeline stage, the input terminal of the $T^{th}$ pipeline stage is connected with a positive input terminal of a subtractor of the $T^{th}$ pipeline stage, an output terminal of the subtractor of the $T^{th}$ pipeline stage is connected with an input terminal of an analogue-to-digital converter of the $T^{th}$ pipeline stage, a first output terminal of the analogue-to-digital converter of the $T^{th}$ pipeline stage is connected with a first input terminal of a digital-to-analog converter of the $T^{th}$ pipeline stage, the analogue-to-digital converter of the $T^{th}$ pipeline stage further comprises a second output terminal, and an output terminal of the digital-to-analog converter of the $T^{th}$ pipeline stage is connected with a negative input terminal of the subtractor of the $T^{th}$ pipeline stage; and the first output terminal of the analogue-to-digital converter of the $T^{th}$ pipeline stage outputs the N-bit quantization result of the quantization period, the second output terminal of the analogue-to-digital converter of the $T^{th}$ pipeline stage outputs the M-bit quantization result of the amplification and extra quantization period, and an (N+M)-bit quantization result of the $T^{th}$ pipeline stage is obtained by two quantization;

wherein 1≤N, 1≤M, and M≤N.

* * * * *